US012677482B2

(12) United States Patent
Jeong et al.

(10) Patent No.: US 12,677,482 B2
(45) Date of Patent: Jul. 7, 2026

(54) DISPLAY DEVICE AND DRIVING METHOD OF THE SAME

(71) Applicant: LG Display Co., Ltd., Seoul (KR)

(72) Inventors: Young Min Jeong, Paju-si (KR); Won Ho Lee, Paju-si (KR); Byung Sam Min, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/936,945

(22) Filed: Nov. 4, 2024

(65) Prior Publication Data

US 2025/0221046 A1 Jul. 3, 2025

(30) Foreign Application Priority Data

Dec. 27, 2023 (KR) ........................ 10-2023-0192932

(51) Int. Cl.
| | |
|---|---|
| *G09G 3/3291* | (2016.01) |
| *G09G 3/3233* | (2016.01) |
| *H10D 86/40* | (2025.01) |
| *H10D 86/60* | (2025.01) |

(52) U.S. Cl.
CPC ........... *H10D 86/60* (2025.01); *G09G 3/3233* (2013.01); *H10D 86/441* (2025.01); *G09G 2300/0452* (2013.01); *G09G 2300/0465* (2013.01); *G09G 2300/0842* (2013.01); *G09G 2320/0247* (2013.01); *G09G 2320/045* (2013.01); *G09G 2320/046* (2013.01)

(58) Field of Classification Search
CPC .... G09G 3/30–3291; G09G 3/00; G09G 3/20;

G09G 2300/0452; G09G 2300/0465; G09G 2300/0842; G09G 2320/0247; G09G 2320/045; G09G 2320/046; H01L 27/12; H01L 27/32; H01L 51/52; H10K 59/18; H10K 59/35; H10K 59/122; H10D 86/60; H10D 86/441

See application file for complete search history.

(56) References Cited

U.S. PATENT DOCUMENTS

| | | | |
|---|---|---|---|
| 9,626,915 B2 | 4/2017 | Park et al. | |
| 2004/0234163 A1* | 11/2004 | Lee ....................... | G09G 3/2003 |
| | | | 382/298 |
| 2006/0262251 A1* | 11/2006 | Kim .................. | G02F 1/133514 |
| | | | 349/106 |

(Continued)

FOREIGN PATENT DOCUMENTS

| | | |
|---|---|---|
| KR | 10-2017-0067402 A | 6/2017 |
| KR | 10-1996432 B1 | 7/2019 |

(Continued)

*Primary Examiner* — Chanh D Nguyen
*Assistant Examiner* — Nguyen H Truong
(74) *Attorney, Agent, or Firm* — Fenwick & West LLP

(57) ABSTRACT

Provided is a display device including a first pixel connected to a first gate line and a first reference line, a second pixel connected to the first gate line and a second reference line, a third pixel connected to a second gate line and the second reference line, and a fourth pixel connected to the second gate line and the first reference line, wherein the first pixel and the third pixel each include a same number of pixels, and the second pixel and the fourth pixel each include a same number of pixels that is less than the number of pixels included in the first pixel and the third pixel.

20 Claims, 18 Drawing Sheets

(56)         References Cited

U.S. PATENT DOCUMENTS

| | | | | |
|---|---|---|---|---|
| 2011/0181633 | A1* | 7/2011 | Higashi ................ | G09G 3/2003 |
| | | | | 345/691 |
| 2014/0078197 | A1 | 3/2014 | Park et al. | |
| 2016/0351096 | A1* | 12/2016 | Tani ..................... | G09G 3/3233 |
| 2021/0064170 | A1* | 3/2021 | Hwang ................... | G06F 3/016 |
| 2023/0386395 | A1* | 11/2023 | Kim ......................... | G09G 3/32 |
| 2024/0341160 | A1* | 10/2024 | Shin .................. | H10K 59/8792 |
| 2024/0405188 | A1* | 12/2024 | Isono ................ | H01L 25/0753 |
| 2025/0046244 | A1* | 2/2025 | Yu .......................... | H10K 59/65 |

FOREIGN PATENT DOCUMENTS

| | | | |
|---|---|---|---|
| KR | 10-2113613 | B1 | 5/2020 |
| KR | 10-2520698 | B1 | 4/2023 |

* cited by examiner

PAT2

Gate[j]

Gate[k]

150

DISPLAY DEVICE AND DRIVING METHOD OF THE SAME

CROSS-REFERENCE TO RELATED APPLICATION

This application claims the benefit of Republic of Korea Patent Application No. 10-2023-0192932, filed on Dec. 27, 2023, which is hereby incorporated by reference in its entirety.

BACKGROUND

Field

The present disclosure relates to a display device and a driving method of the same.

Discussion of the Related Art

As information technology develops, the market for display devices, which are communication media between users and information, is growing. Accordingly, display devices such as a light emitting display (LED) device, a quantum dot display (QDD) device, and a liquid crystal display (LCD) device are increasingly used.

The display devices described above include a display panel including subpixels, a driver outputting driving signals for driving the display panel, and a power supply for generating power to be supplied to the display panel or the driver.

In such display devices, when driving signals, for example, a scan signal and a data signal, are supplied to subpixels formed in a display panel, selected subpixels transmit light or directly emit light, thereby displaying an image.

SUMMARY

Accordingly, the present disclosure is directed to a display device and a driving method of the same that substantially obviate one or more problems due to limitations and disadvantages of the related art.

An object of the present disclosure is to improve (offset) the problem of deviation that may occur on a display panel, enhance display quality by minimizing or at least reducing flicker or image interference, and implement a display panel with a high aperture ratio and a high PPI (Pixel Per Inch) to improve the lifespan without burn-in.

Additional advantages, objects, and features of the present disclosure will be set forth in part in the description which follows and in part will become apparent to those having ordinary skill in the art upon examination of the following or may be learned from practice of the present disclosure. The objectives and other advantages of the present disclosure may be realized and attained by the structure particularly pointed out in the written description and claims hereof as well as the appended drawings.

To achieve these objects and other advantages and in accordance with the purpose of the present disclosure, as embodied and broadly described herein, a display device comprises: a first pixel included in a first row of pixels, the first pixel connected to a first gate line and a first reference line; a second pixel included in the first row of pixels, the second pixel connected to the first gate line and a second reference line; a third pixel in a second row of pixels that is after the first row of pixels, the third pixel connected to a second gate line and the second reference line; and a fourth pixel in the second row of pixels, the fourth pixel connected to the second gate line and the first reference line, wherein the second pixel and fourth pixel have a same number of subpixels and the first pixel and the third pixel have a same number of subpixels that is more than the number of subpixels in the second pixel and the fourth pixel.

In one embodiment, a display device comprises: a first pixel that is connected to a first gate line and included in a first row of pixels, the first pixel comprising four subpixels and a first connection line that connect the four subpixels of the first pixel to a first reference line; a second pixel that is connected to the first gate line and included in the first row of pixels, the second pixel comprising three subpixels and a second connection line that connects the three subpixels of the second pixel to a second reference line; a third pixel that is connected to a second gate line and included in a second row of pixels that is after the first row of pixels, the third pixel comprising fourth subpixels and a third connection line that connect the four subpixels of the third pixel to the second reference line; and a fourth pixel that is connected to the second gate line and included in the second row of pixels, the fourth pixel comprising three subpixels and a fourth connection line that connect the three subpixels of the fourth pixel to the first reference line.

In one embodiment, a display device comprises: a display panel including a plurality of pixels that are arranged in a plurality of rows and a plurality of columns of pixels, a plurality of data lines connected to the plurality of pixels, a plurality of gate lines connected to the plurality of pixels, and a plurality of reference lines connected to the plurality of pixels; a data driver configured to apply data voltages to the plurality of data lines; and a gate driver configured to apply gate signals to the plurality of gate lines, wherein the display panel comprises: a first pixel included in a first row of pixels and comprises a first white subpixel, the first pixel connected to a first gate line from the plurality of gate lines and a first reference line from the plurality of reference lines; a second pixel included in the first row of pixels and lacks a white subpixel, the second pixel connected to the first gate line and a second reference line from the plurality of reference lines; a third pixel in a second row of pixels that is after the first row of pixels in the plurality of rows of pixels and comprises a second white subpixel that is in a same column of pixels as the first white subpixel, the third pixel connected to a second gate line from the plurality of gate lines and the second reference line; and a fourth pixel in the second row of pixels that lacks a white subpixel, the fourth pixel connected to the second gate line and the first reference line, wherein gate driver is configured to output a first gate signal to the first gate line that turns on the first pixel and the second pixel and a second gate signal to the second gate line after the first gate signal is output that turns on the third pixel and the fourth pixel, the second gate signal having a gate-on level while the first gate signal has the gate-on level and transitions from the gate-on level to a gate-off level, wherein a first sensing value of the first white subpixel is sensed via the first reference line and a second sensing value of the second white subpixel is sensed via the second reference line during a duration while the first gate signal and the second gate signal have the gate-on level, and a data voltage of at least one of the first pixel or third pixel is compensated based on the first sensing value and the second sensing value.

It is to be understood that both the foregoing general description and the following detailed description of the present disclosure are exemplary and explanatory and are intended to provide further explanation of the present disclosure as claimed.

BRIEF DESCRIPTION OF THE DRAWINGS

The accompanying drawings, which are included to provide a further understanding of the present disclosure and are incorporated in and constitute a part of this application, illustrate embodiment(s) of the present disclosure and together with the description serve to explain the principle of the present disclosure. In the drawings.

DETAILED DESCRIPTION

A display device according to the present disclosure may be implemented as a television system, an image player, a personal computer (PC), a home theater, an automobile electric device, a smartphone, or the like, but is not limited thereto. The display device according to the present disclosure may be implemented as a light emitting display (LED) device, a quantum dot display (QDD) device, a liquid crystal display (LCD) device, or the like. However, for convenience of description, as an example, a light emitting display device that directly emits light based on inorganic light emitting diodes or organic light emitting diodes will be described below.

Figure 1:
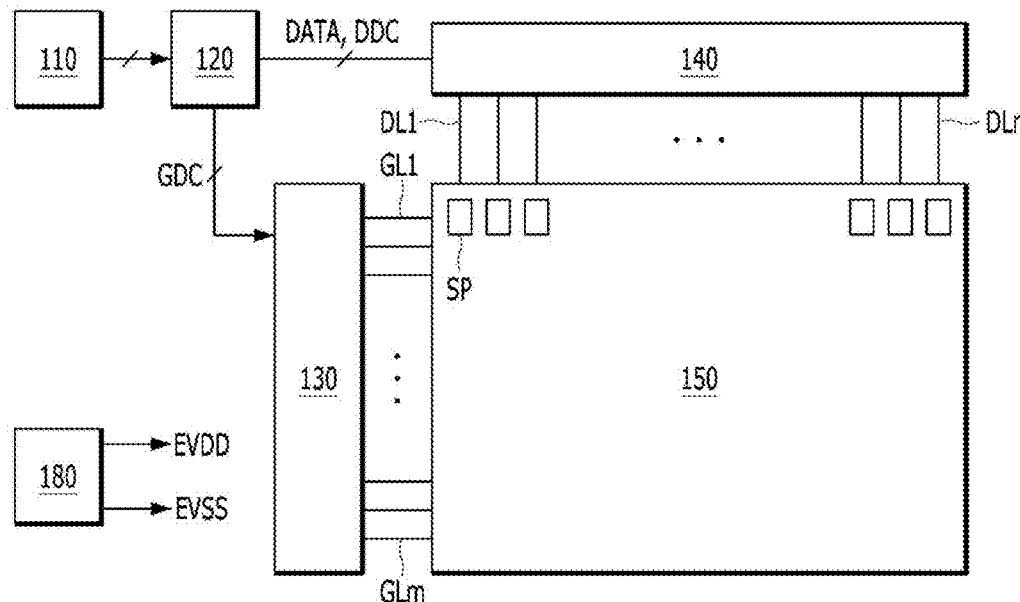
FIG. 1 is a block diagram schematically showing a light emitting display device according to one embodiment.
Figure 2:
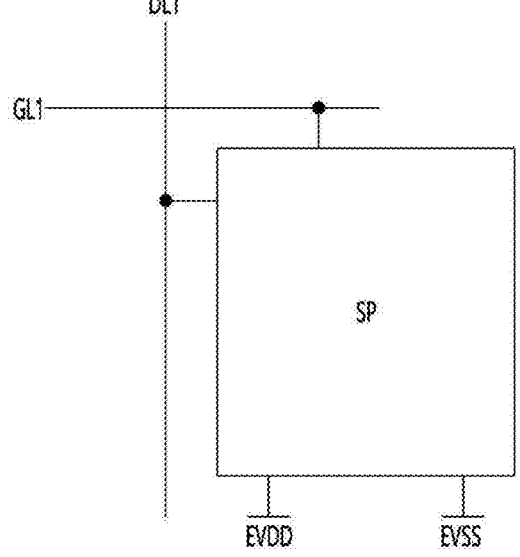
FIG. 2 is a configuration diagram schematically showing a subpixel shown in FIG. 1 according to one embodiment.
Figure 3:
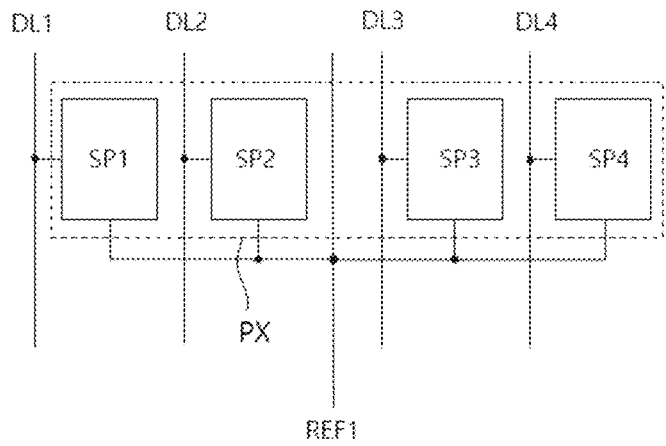
FIG. 3 is a diagram illustrating a pixel composed of subpixels according to one embodiment.

FIG. 1 is a block diagram schematically showing a light emitting display device according to one embodiment, FIG. 2 is a configuration diagram schematically showing a subpixel shown in FIG. 1 according to one embodiment, and FIG. 3 is a diagram showing a pixel composed of subpixels according to one embodiment.

As illustrated in FIG. 1, FIG. 2, and FIG. 3, the light emitting display device may include an image provider 110, a timing controller 120, a gate driver 130, a data driver 140, a display panel 150, a power supply 180, and the like.

The image provider 110 (a set or a host system) may output various driving signals along with an externally supplied image data signal or an image data signal stored in an internal memory. The image provider 110 may supply data signals and various driving signals to the timing controller 120.

The timing controller 120 may output a gate timing control signal GDC for controlling the operation timing of the gate driver 130, a data timing control signal DDC for controlling the operation timing of the data driver 140, and various synchronization signals. The timing controller 120 may supply a data signal DATA supplied from the image provider 110 to the data driver 140 along with the data timing control signal DDC. The timing controller 120 may be implemented in the form of an integrated circuit (IC) and mounted on a printed circuit board, but is not limited thereto.

The gate driver 130 may output a gate signal (or a gate voltage) in response to the gate timing control signal GDC supplied from the timing controller 120. The gate driver 130 may supply gate signals to subpixels included in the display panel 150 through gate lines GL1 to GLm. The gate driver 130 may be implemented in the form of an IC or directly formed on the display panel 150 in a gate-in-panel structure, but is not limited thereto.

The data driver 140 may sample and latch the data signal DATA in response to the data timing control signal DDC supplied from the timing controller 120, convert the digital data signal into an analog data voltage on the basis of a gamma reference voltage, and output the analog data voltage. The data driver 140 may supply data voltages to the subpixels included in the display panel 150 through data lines DL1 to DLn. The data driver 140 may be implemented in the form of an integrated circuit (IC) and mounted on the display panel 150 or mounted on a printed circuit board, but is not limited thereto.

The power supply 180 can generate first power at a high level and second power at a low level on the basis of an external input voltage supplied from the outside. The power supply 180 may output the first power through a first power line EVDD and output the second power through a second power line EVSS. The power supply 180 may generate and output voltages (e.g., a scan high voltage and a scan low voltage) necessary to drive the gate driver 130 and voltages (e.g., a drain voltage and a half drain voltage) necessary to drive the data driver 140 as well as the first power and the second power.

In one embodiment, the display panel 150 includes a plurality of pixels PX that are arranged in a plurality of rows of pixels and a plurality of columns of pixel. The display panel 150 may display an image using the pixels in response to driving signals including a scan signal and a data voltage, the first power, and the second power. The subpixels of the display panel 150 may directly emit light. The display panel 150 may be manufactured based on a substrate having rigidity or flexibility, such as glass, silicon, polyimide, or the like. For example, one subpixel SP may be connected to the first data line DL1, the first gate line GL1, the first power line EVDD, and the second power line EVSS and may include a pixel circuit including a switching transistor, a driving transistor, a capacitor, an organic light emitting diode, etc.

Subpixels SP used in the light-emitting display device directly emit light, and thus the circuit configuration thereof is complicated. In addition, there are various compensation circuits that compensate for deterioration of not only the organic light emitting diode emitting light but also the driving transistor that supplies a driving current necessary to drive the organic light emitting diode. Therefore, the subpixel SP is simply shown in the form of a block.

A pixel emitting light may be composed of red, green, and blue subpixels or red, green, blue, and white subpixels. For example, one pixel PX may include a red subpixel SP1 connected to the first data line DL1, a white subpixel SP2 connected to the second data line DL2, a green subpixel SP3 connected to the third data line DL3, and a blue subpixel SP4 connected to the fourth data line DL4. Additionally, the red subpixel SP1, white subpixel SP2, green subpixel SP3, and blue subpixel SP4 may be commonly connected to a first reference line REF1. The first reference line REF1 may be used to sense deterioration of elements included in one of the red subpixel SP1, white subpixel SP2, green subpixel SP3, and blue subpixel SP4, which will be described below.

Meanwhile, the timing controller 120, the gate driver 130, and the data driver 140 have been described as individual components. However, depending on the implementation method of the light emitting display device, one or more of the timing controller 120, the gate driver 130, and the data driver 140 may be integrated into a single IC. In addition, the timing controller 120, the gate driver 130, the data driver 140, the power supply 180, and the display panel 150 are an assembly for displaying images and may be defined as a display module.

In addition, as an example, the pixels PX in which the red subpixel SP1, white subpixel SP2, green subpixel SP3, and blue subpixel SP4 are arranged in order has been illustrated. However, the arrangement order and direction of subpixels may vary depending on the implementation method of the light emitting display device.

Figure 4:
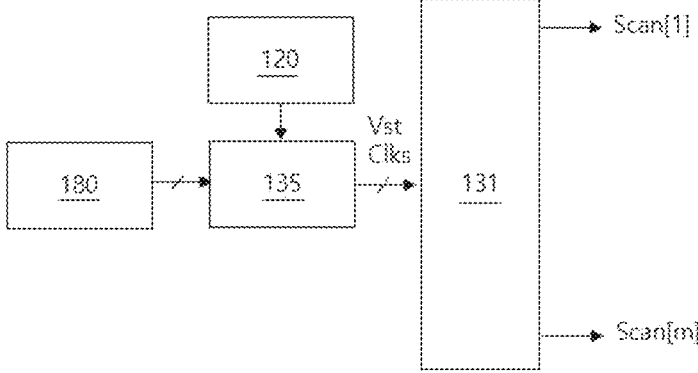
FIG. 4 and FIG. 5 are diagrams illustrating the configuration of a gate-in-panel type gate driver according to one embodiment.
Figure 5:
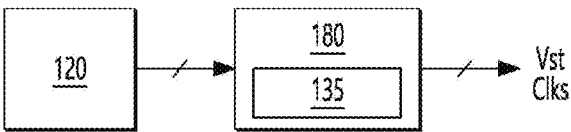
Figure 6:
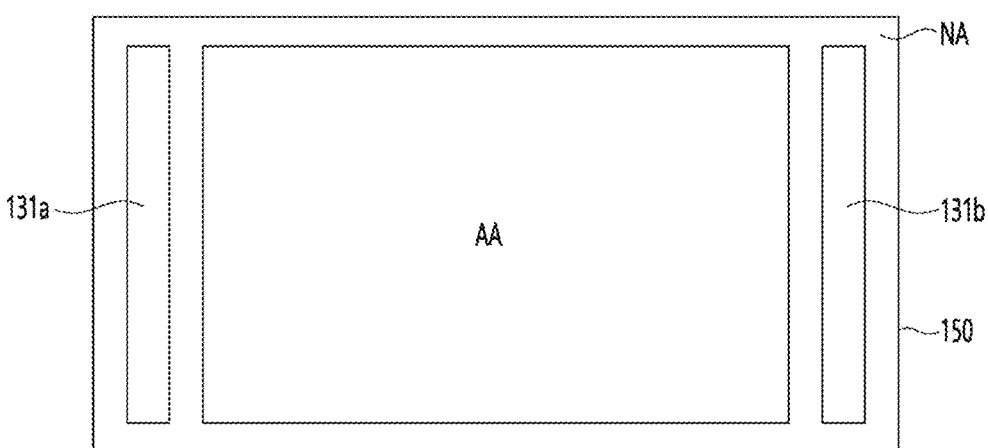
FIG. 6 is a diagram showing an example of the arrangement of the gate-in-panel type gate driver according to one embodiment.

FIG. 4 and FIG. 5 are diagrams illustrating the configuration of a gate-in-panel type gate driver according to one embodiment, and FIG. 6 is a diagram showing an example of the arrangement of the gate-in-panel type gate driver according to one embodiment.

As shown in FIG. 4, the gate-in-panel type gate driver may include a shift register 131 and a level shifter 135. The level shifter 135 may generate driving clock signals Clks and a start signal Vst on the basis of signals and voltages output from the timing controller 120 and the power supply 180.

The shift register 131 operates on the basis of signals Clks and Vst output from the level shifter 135, and may output gate signals Scan[1] to Scan[m] for turning on or off transistors formed in the display panel. The shift register 131 may take the form of a thin film on the display panel in a gate-in-panel structure.

As shown in FIG. 4 and FIG. 5, unlike the shift register 131, the level shifter 135 may be formed independently in the form of an IC or may be included in the power supply 180. However, this is merely an example and is not limited to thereto.

As shown in FIG. 6, shift registers 131a and 131b that output gate signals in the gate-in-panel type gate driver may be disposed in a non-display area NA of the display panel 150. As an example, the shift registers 131a and 131b are disposed in the left and right non-display areas NA of the display panel 150, but the shift registers 131a and 131b may also be disposed in upper and lower non-display areas NA of the display panel 150 or may be disposed within a display area AA of the display panel 150.

Figure 7:
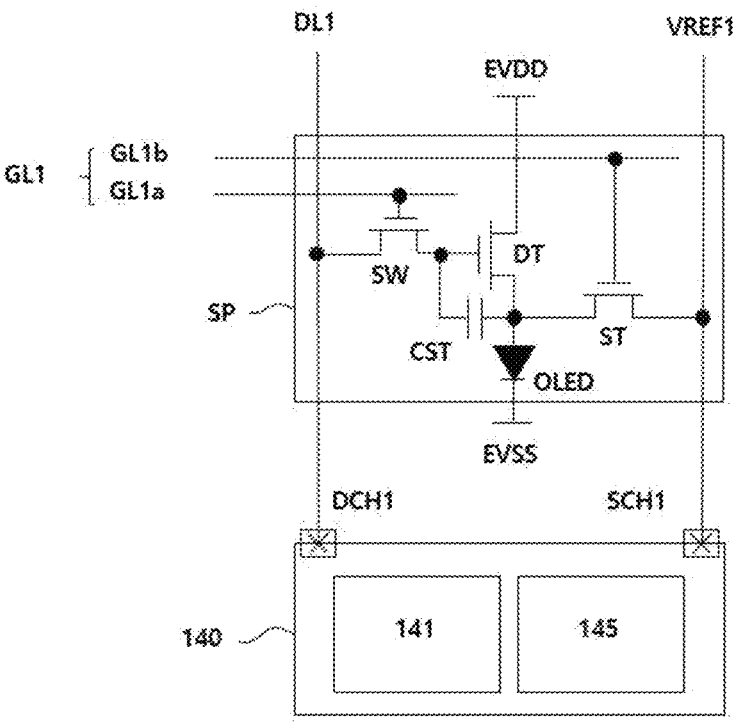
FIG. 7 is a diagram schematically showing a subpixel and a data driver according to a first example of an embodiment.
Figure 8:
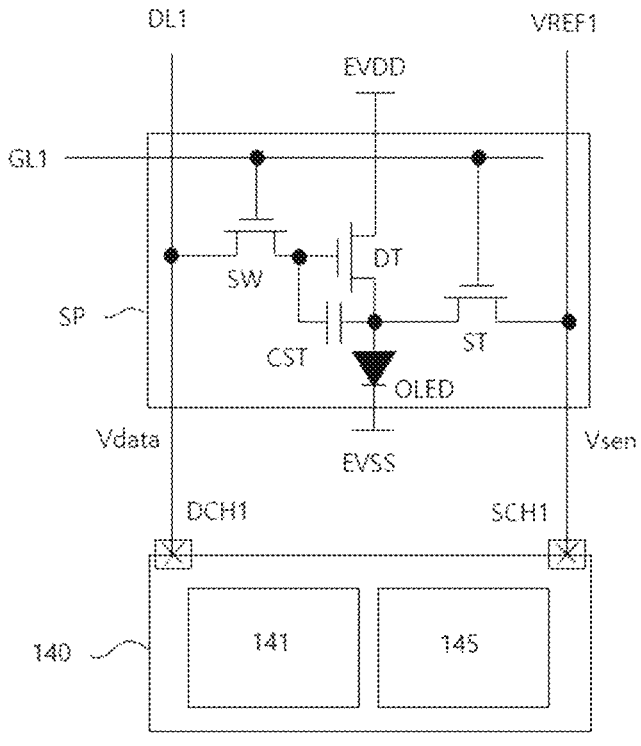
FIG. 8 is a diagram schematically showing a subpixel and a data driver according to a second example of the embodiment.
Figure 9:
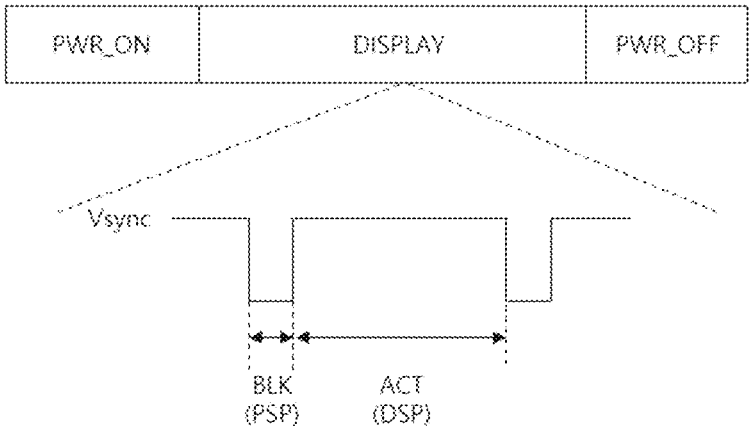
FIG. 9 is a waveform diagram illustrating a sensing period and a display period according to the embodiment.

FIG. 7 is a diagram schematically showing a subpixel and a data driver according to a first example of an embodiment, FIG. 8 is a diagram schematically showing a subpixel and a data driver according to a second example of the embodiment, and FIG. 9 is a waveform diagram illustrating a sensing period and a display period.

As shown in FIG. 7, according to the first example, one subpixel SP may include a switching transistor SW, a driving transistor DT, a sensing transistor ST, a capacitor CST, and an organic light emitting diode OLED.

The driving transistor DT may include a gate electrode connected to a first electrode of the capacitor CST, a first electrode connected to the first power line EVDD, and a second electrode connected to the anode of the organic light emitting diode OLED. The capacitor CST may have the first electrode connected to the gate electrode of the driving transistor DT and a second electrode connected to the anode electrode of the organic light emitting diode OLED. The organic light emitting diode OLED may have the anode connected to the second electrode of the driving transistor DT and a cathode connected to the second power line EVSS.

The switching transistor SW may include a gate electrode connected to a first scan line GL1a included in the first gate line GL1, a first electrode connected to the first data line DL1, and a second electrode connected to the gate electrode of the driving transistor DT. The sensing transistor ST may include a gate electrode connected to a second scan line GL1b included in the first gate line GL1, a first electrode connected to the first reference line VREF1, and a second electrode connected to the anode of the organic light emitting diode OLED.

The sensing transistor ST is a kind of compensation circuit added to compensate for deterioration (in the threshold voltage, mobility, etc.) of the driving transistor DT or the organic light emitting diode OLED. The sensing transistor ST can enable physical threshold voltage sensing based on the source follower operation of the driving transistor DT. The sensing transistor ST can operate to acquire a sensing voltage through a sensing node defined between the driving transistor DT and the organic light emitting diode OLED.

According to an embodiment, the data driver 140 may include a driving circuit 141 for driving the subpixel SP and a sensing circuit 145 for sensing the subpixel SP. The driving circuit 141 may be connected to the first data line DL1 through a first data channel DCH1. The driving circuit 141 may output a data voltage Vdata for driving the subpixel SP through the first data channel DCH1.

The sensing circuit 145 may be connected to the first reference line VREF1 through a first sensing channel SCH1. The sensing circuit 145 may acquire a sensing voltage Vsen sensed from the subpixel SP through the first sensing channel SCH1. The sensing circuit 145 may acquire the sensing voltage Vsen based on a current sensing or voltage sensing method. The sensing circuit 145 may send (transmit) the acquired sensing voltage Vsen to the timing controller such that deterioration of the elements included in the subpixels SP can be determined and deterioration compensation can be performed on the basis of the sensing voltage Vsen.

As shown in FIG. 8, according to the second example, the first gate line GL1 may be integrated into one scan line. That is, unlike the first example, the first gate line GL1 may not be divided into the first scan line and the second scan line. In this case, the switching transistor SW and the sensing transistor ST are commonly connected to the first gate line GL1, and thus can be turned on or off at the same time.

As shown in FIG. 9, the light emitting display device according to the embodiment may adopt driving modes respectively corresponding to a first driving period PWR_ON, a second driving period DISPLAY, and a third driving period PWR_OFF when operating to drive the display panel.

The first driving period PWR_ON may correspond to a driving start period in which power is applied to the display panel, the second driving period DISPLAY may correspond to a panel driving period in which operation such as displaying an image is performed after the power is applied to the display panel, and a third driving period PWR_OFF may correspond to a driving end period in which the power applied to the display panel is cut off. Meanwhile, the third driving period PWR_OFF is a period in which the display panel is driven for a certain period of time while displaying a black image such that the sensing operation of the display panel can be performed. That is, note that the power applied to the display panel and the like is not completely cut off during the third driving period PWR_OFF in order to perform the sensing of the display panel.

The light emitting display device according to the embodiment may sense the display panel in at least one of the first drive period PWR_ON, the second drive period DISPLAY, and the third drive period PWR_OFF. As an example, in the second driving period DISPLAY, a blank period BLK included in the vertical synchronization signal Vsync may be defined as a sensing period PSP, and an active period ACT included in the vertical synchronization signal Vsync may be defined as a display period DSP.

Figure 10:
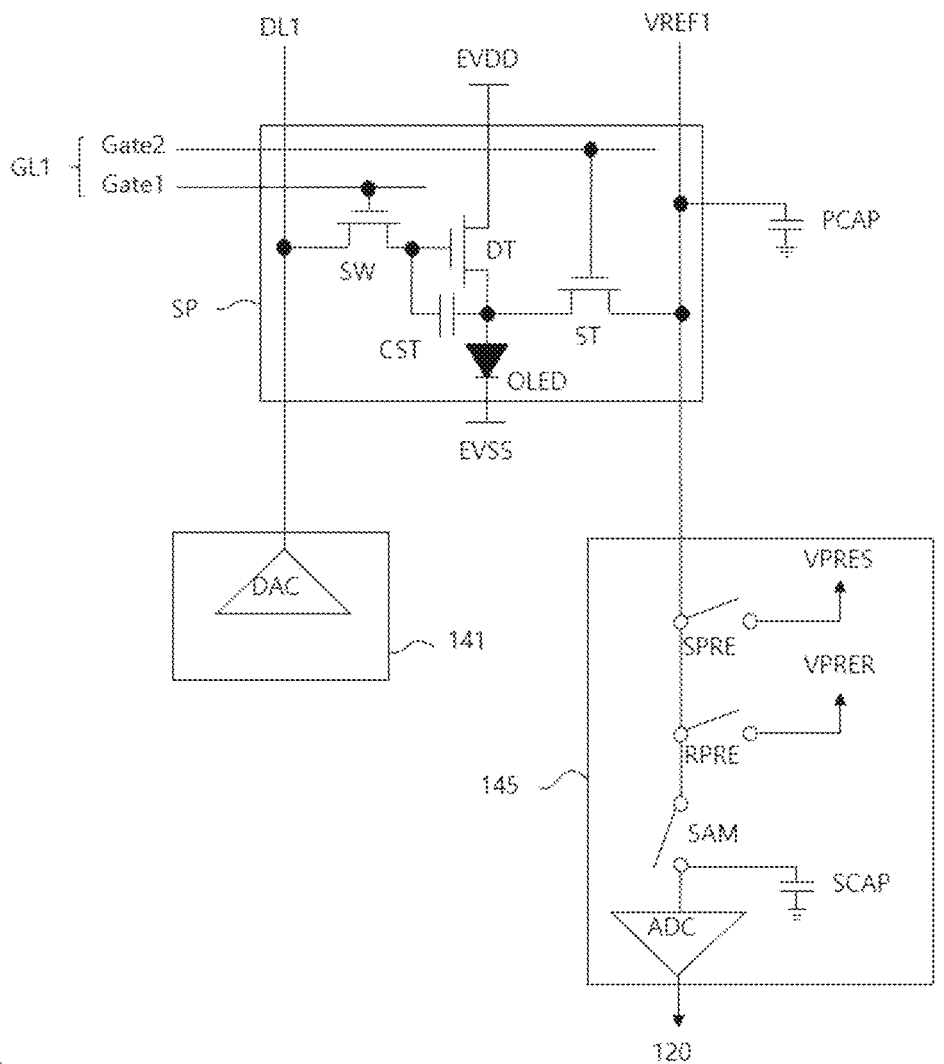
FIG. 10 is a diagram showing some of components included in the data driver according to one embodiment.
Figure 11:
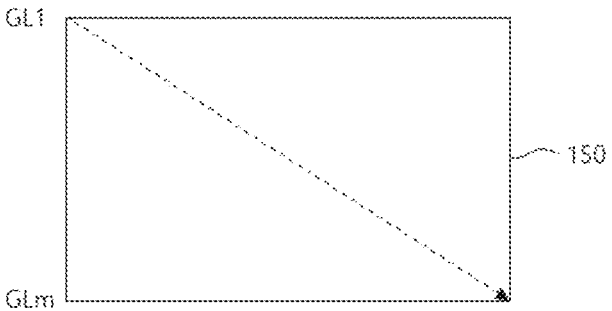
FIG. 11 and FIG. 12 are diagrams showing a method of sensing a display panel according to one embodiment.
Figure 12:
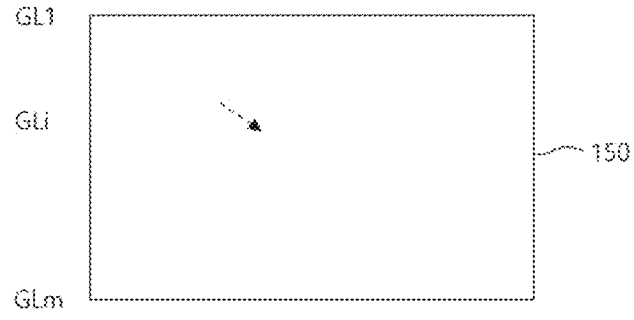

FIG. 10 is a diagram showing some of the components included in the data driver according to an embodiment, and FIG. 11 and FIG. 12 are diagrams showing a method of sensing the display panel according to the embodiment. Hereinafter, as an example, the structure of the subpixel SP shown in FIG. 7 will be described.

As in the embodiment shown in FIG. 10, the driving circuit 141 may include a digital-to-analog converter DAC to output a sensing data voltage, a black data voltage, or a display data voltage through the first data line DL1. The sensing circuit 145 may include a first voltage circuit SPRE, a second voltage circuit RPRE, a sampling circuit SAM, and an analog-to-digital converter ADC to output and sense a voltage through the first reference line VREF1.

The first voltage circuit SPRE and the second voltage circuit RPRE may perform a voltage output operation to initialize nodes or circuits included in the subpixel SP or charge the same to a specific voltage level. The first voltage circuit SPRE and the second voltage circuit RPRE may include a first reference voltage source VPRES and a second reference voltage source VPRER, respectively. The first voltage circuit SPRE may output a first reference voltage on the basis of the first reference voltage source VPRES, and the second voltage circuit RPRE may output a second reference voltage on the basis of the second reference voltage source VPRER. The first reference voltage may be set to a voltage lower than the second reference voltage.

The sampling circuit SAM can perform a sampling operation to acquire a sensing voltage through the first reference line VREF1. For example, the sampling circuit SAM may acquire the sensing voltage from a sensing capacitor PCAP formed on the first reference line VREF1 on the basis of the sensing capacitor SCAP.

The analog-to-digital converter ADC can convert the analog sensing voltage acquired by the sampling circuit SAM into a digital sensing voltage and output the same. For example, the analog-to-digital converter ADC can convert the analog sensing voltage charged in the sensing capacitor SCAP into a digital sensing voltage and output the same.

The timing controller 120 may receive a sensing voltage (sensing data value) from the sensing circuit 145. The timing controller 120 may determine whether the driving transistor DT or the organic light emitting diode OLED included in the subpixel SP has deteriorated on the basis of the sensing voltage and perform an operation for compensating for the deterioration.

As shown in FIG. 11, according to the first example, the light emitting display device may perform a sequential sensing method in which sensing is performed from the first gate line GL1 to the M-th gate line GLm of the display panel 150. Although FIG. 11 illustrates an example in which sensing is performed sequentially starting from the first gate line GL1, which is the top of the display panel 150, sensing may start from the M-th gate line GLm, which is the bottom of the display panel 150.

As shown in FIG. 12, according to the second example, the light emitting display device may perform a random sensing method in which only an I-th gate line GLi of the display panel 150 is sensed. Although FIG. 12 illustrates an example in which only the I-th gate line GLi, which is one of specific gate lines, is sensed, the sensing target may be two or more gate lines.

Figure 13:
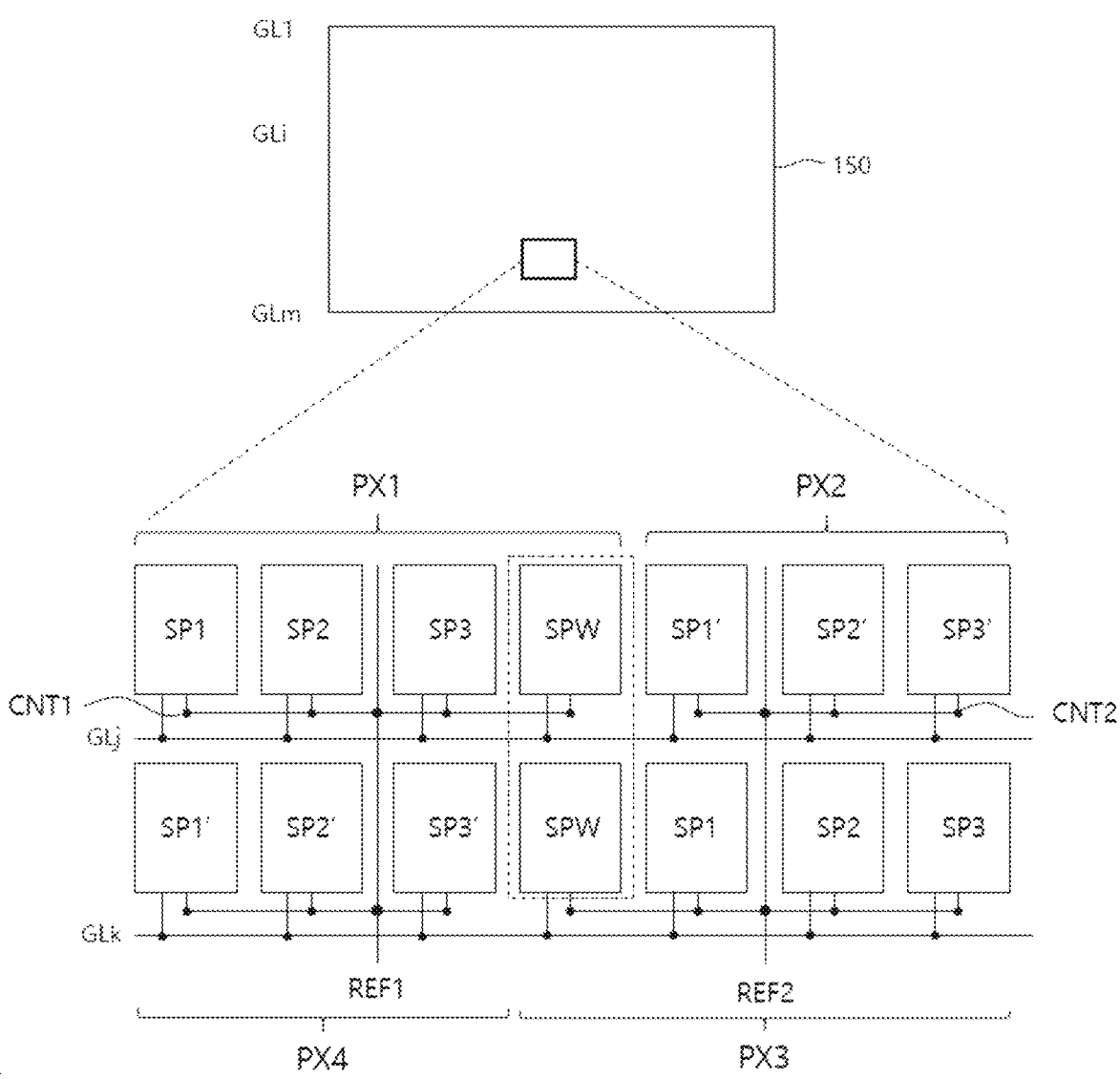
FIG. 13 is a diagram showing a display panel of a light emitting display device and pixel groups formed therein according to an embodiment.
Figure 14:
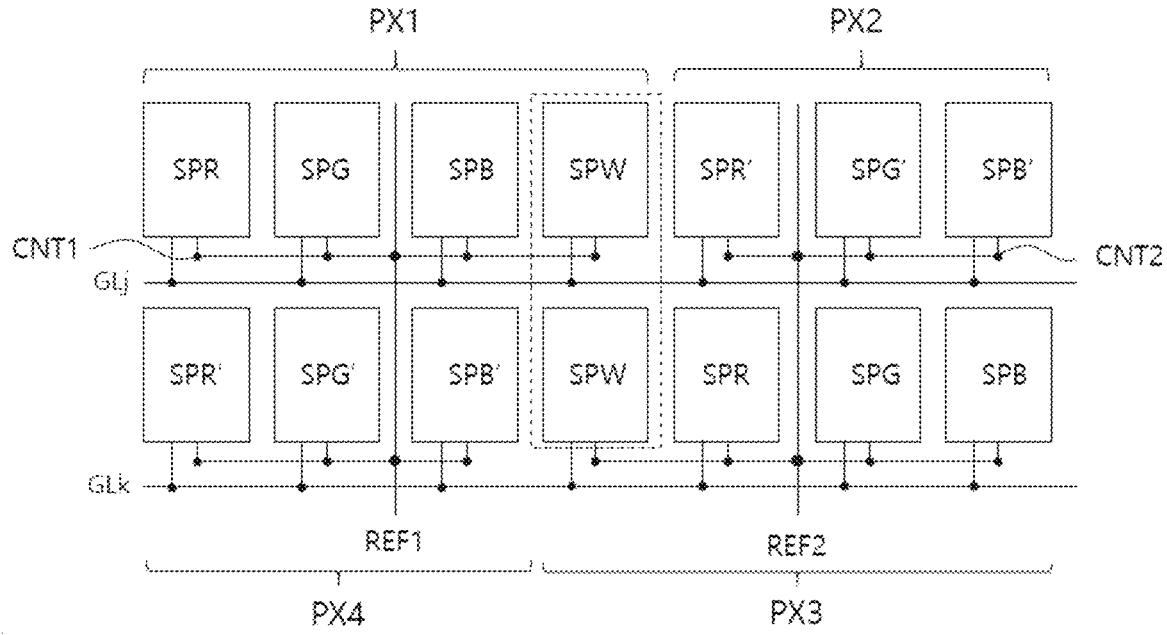
FIG. 14 is a diagram illustrating specific pixel groups shown in FIG. 13 according to one embodiment.

FIG. 13 is a diagram showing a display panel of a light emitting display device and some pixel groups formed therein according to an embodiment, and FIG. 14 is a diagram illustrating specific pixel groups shown in FIG. 13 according to one embodiment.

As shown in FIG. 13, the display panel 150 that emits light in the light emitting display device according to the embodiment may include a first pixel group PX1 and PX3 that each include four subpixels and a second pixel group PX2 and PX4 that each include three subpixels. The first pixel group PX1 and the second pixel group PX2 are arranged in a first row of pixels and the third pixel group PX3 and the fourth pixel group PX4 are arranged in a second row of pixels that is after the first row of pixels.

The first pixel groups PX1 and PX3 may include a first pixel PX1 located on one side (e.g., a first side) of a J-th gate line GLj and a third pixel PX3 located on the other side (e.g., a second side) of a K-th gate line GLk. Each of the first pixel PX1 and the third pixel PX3 may include a first subpixel SP1 that emits light of a first color, a second subpixel SP2 that emits light of a second color, a third subpixel SP3 that emits light of a third color, and a white subpixel SPW that emits white light. As shown in FIG. 13, the white subpixel SPW of the first pixel PX1 and the white subpixel SPW of the third pixel PX3 are in a same column of pixels.

While both the first pixel PX1 and the third pixel PX3 include three subpixels SP1 to SP3 and one white subpixel SPW, they are different from each other in that the first pixel PX1 is connected to a first reference line REF1 and the third pixel PX3 is connected to a second reference line REF2 that is different from the first reference line REF1. In addition, the first pixel PX1 may include a first connection line CNT1 for connecting the three subpixels SP1 to SP3 and one white subpixel SPW to the first reference line REF1 and the third pixel PX3 may also include its respective first connection lines CNT1 for connecting the three subpixels SP1 to SP3 and one white subpixel SPW to the second reference line REF2. In one embodiment, a length of the first connection line CNT1 of the first pixel PX1 is a same as a length of the first connection line CNT1 of the third pixel PX3.

The second pixel group PX2 and PX4 may include a second pixel PX2 located on the other side of the J-th gate line GLj and a fourth pixel PX4 located on one side of the K-th gate line GLk. Each of the second pixel PX2 and the fourth pixel PX4 may include a first subpixel SP1' that emits light of a first color, a second subpixel SP2' that emits light of a second color, and a third subpixel SP3' that emits light of a third color. As shown in FIG. 13, the subpixels of the second pixel PX2 are in a same row as the subpixels of the first pixel PX1 and the subpixels of the third pixel PX2 are in a same row as the subpixels of the fourth pixel PX4. Thus, the third pixel PX3 is in a different pixel row than the first pixel PX1 and the second pixel PX2 is in a different pixel row than the fourth pixel PX4.

While both the second pixel PX2 and the fourth pixel PX4 each include three subpixels SP1' to SP3', they are different from each other in that the second pixel PX2 is connected to the second reference line REF2 and the fourth pixel PX4 is connected to the first reference line REF1. In addition, the second pixel PX2 may include a second connection line CNT2 for connecting the three subpixels SP1' to SP3' to the second reference line REF2 and the fourth pixel PX4 may also include its respective second connection line CNT2 for connecting the three subpixels SP1' to SP3' to the first reference line REF1. In one embodiment, a length of the second connection line CNT2 of the second pixel PX2 is a same as a length of the second connection line CNT2 of the fourth pixel PX4.

Referring to the above description and FIG. 13, a pixel including four subpixels and a pixel including three subpixels may be connected to the J-th gate line GLj (left and right pixels are asymmetrically arranged). Additionally, the positions of the pixels may be changed for the K-th gate line GLk located next to the J-th gate line GLj (asymmetrical arrangement alternates for each gate line). In other words, the first pixel PX1 and the third pixel PX3, and the second pixel PX2 and the fourth pixel PX4 are disposed alternately on one side and the other side with respect to each gate line (or positions of pixels including white subpixels are changed to one side and the other side for each gate line in a zigzag arrangement).

In addition, a white subpixel SPW may be located between the first to third subpixels SP1 to SP3 and the first to third subpixels SP1' to SP3'. In other words, the first to third subpixels SP1 to SP3 and the first to third subpixels SP1' to SP3' may share the white subpixel SPW in a zigzag shape. The structure in which the white subpixel SPW is shared enables implementation of a display panel with a high aperture ratio and high PPI (Pixel Per Inch), which can improve the lifespan without burn-in.

Referring to FIG. 13 and FIG. 14, the first subpixel SP1 and the first subpixel SP1' may be selected as red subpixels SPR and SPR' that emit red light. The second subpixel SP2 and the second subpixel SP2' may be selected as green subpixels SPG and SPG' that emit green light. The third subpixel SP3 and the third subpixel SP3' may be selected as blue subpixels SPB and SPB' that emit blue light. However, this is merely an example, and the arrangement order of subpixels is not limited thereto.

Figure 15:
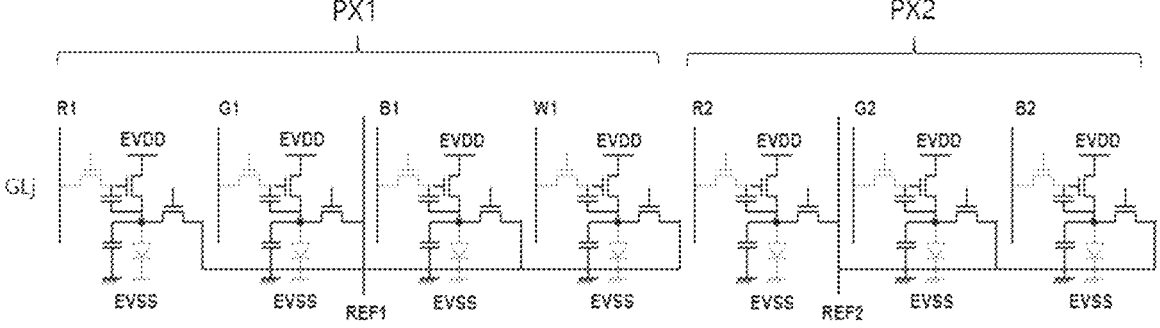
FIG. 15 is a diagram showing pixels located on one gate line according to an embodiment.
Figure 16:
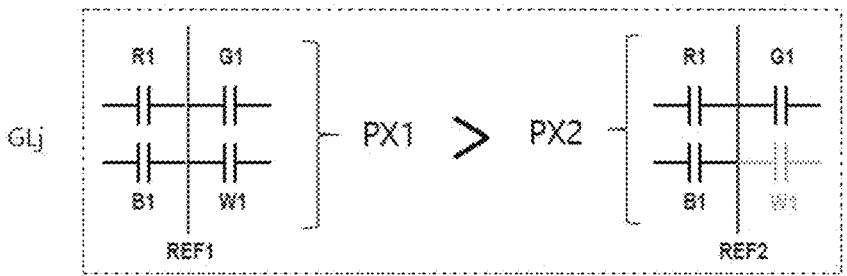
FIG. 16 is a diagram showing deviation that may occur between the pixels shown in FIG. 15 according to one embodiment.
Figure 17:
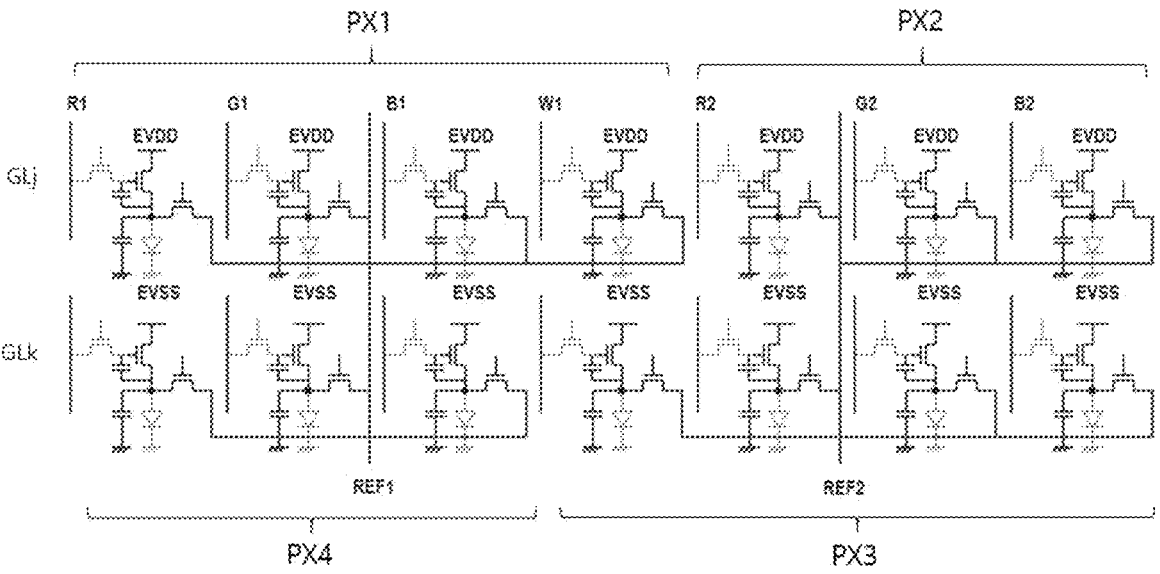
FIG. 17 is a diagram showing pixels located on two neighboring gate lines according to an embodiment.
Figure 18:
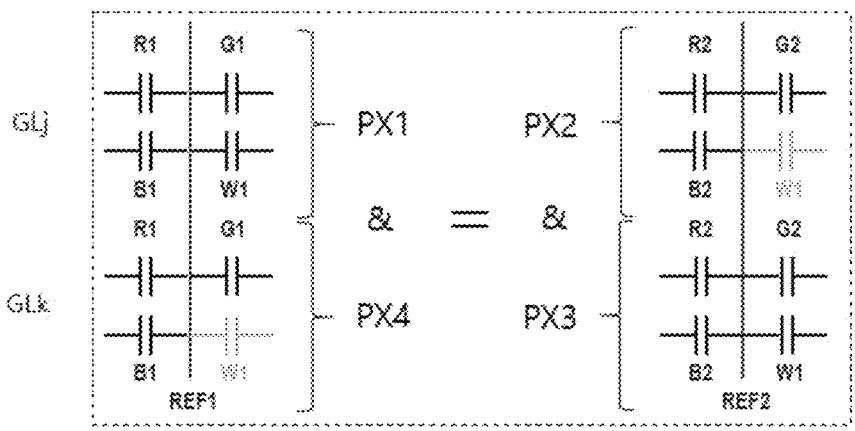
FIG. 18 is a diagram showing deviation that may occur between the pixels shown in FIG. 17 according to one embodiment.

FIG. 15 is a diagram showing pixels located on one gate line according to an embodiment, FIG. 16 is a diagram showing deviation that may occur between the pixels shown in FIG. 15 according to one embodiment, FIG. 17 is a diagram showing pixels located on two neighboring gate lines according to an embodiment, and FIG. 18 is a diagram showing deviation that may occur between the pixels shown in FIG. 17 according to one embodiment.

As shown in FIG. 15, when viewed from the J-th gate line GLj corresponding to one gate line, the first pixel PX1 and the second pixel PX2 may be asymmetric because the first pixel PX1 has a structure in which four subpixels are commonly connected to the first reference line REF1 whereas the second pixel PX2 has a structure in which three subpixels are commonly connected to the second reference line REF2.

If the first pixel PX1 and the second pixel PX2 are arranged asymmetrically with respect to the J-th gate line GLj as shown in FIG. 15, deviation such as a parasitic capacitance difference or a line load difference may occur between the first pixel PX1 and the second pixel PX2. For example, a relationship corresponding to PX1>PX2 may be established between the first pixel PX1 and the second pixel PX2 as shown in FIG. 16. The aforementioned deviation problem may become more severe due to process variation or different driving modes and driving voltages, and thus display quality may deteriorate.

As shown in FIG. 17, when viewed from the J-th gate line GLj corresponding to one gate line, the first pixel PX1 and the second pixel PX2 may be asymmetric. However, when viewed from the J-gate line GLj and the K-th gate line GLk corresponding to two gate lines, the first pixel PX1 and the second pixel PX2 may be symmetrical with the third pixel PX3 and the fourth pixel PX4 which are arranged in an opposite manner.

As shown in FIG. 17, when the first pixel PX1 and the second pixel PX2 located on the J-th gate line GLj are disposed asymmetrically, and the third pixel PX3 and the fourth pixel PX4 located on the K-th gate line GLk are disposed asymmetrically in an opposite manner, deviation such as a parasitic capacitance difference or a line load difference present between the first pixel PX1 to the fourth pixel PX4 can be canceled. For example, a relationship corresponding to PX1 & PX4=PX2 & PX3 can be established between the first and fourth pixels PX1 and PX4 and the second and third pixels PX2 and PX3 (the same load can be applied between the top, bottom, left and right pixels), as shown in FIG. 18.

In this manner, by using a hybrid structure in which the first pixel groups PX1 and PX3 including four subpixels and the second pixel groups PX2 and PX4 including three subpixels are alternately disposed as in the embodiment, deviation that may occur on the display panel can be improved (offset) and flicker or image interference can be minimized, thereby improving display quality.

Meanwhile, in FIG. 15 and FIG. 17, R1 denotes a first red data line, G1 denotes a first green data line, B1 denotes a first blue data line, W1 denotes a first white data line, R2 denotes a second red data line, G2 denotes a second green data line, and B2 denotes a second blue data line. In FIG. 16 and FIGS. 18, R1, G1, B1, and W1 denote parasitic capacitor components that cause deviations in the first red data line, the first green data line, the first blue data line, and the first white data line, and R2, G2, and B2 denote parasitic capacitor components that cause deviations in the second red data line, the second green data line, and the second blue data line.

In FIG. 16 and FIG. 18, W1 indicated in gray denotes a parasitic capacitor component that is actually present or a relatively small parasitic capacitor component.

Hereinafter, an experimental example and an embodiment will be compared and the advantages of the embodiment will be described.

Figure 19:
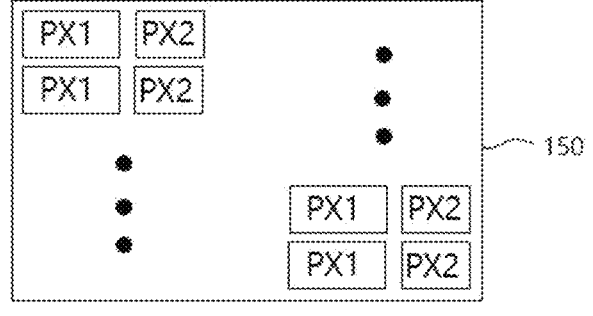
FIG. 19 is a diagram showing a display panel implemented according to an experimental example.
Figure 20:
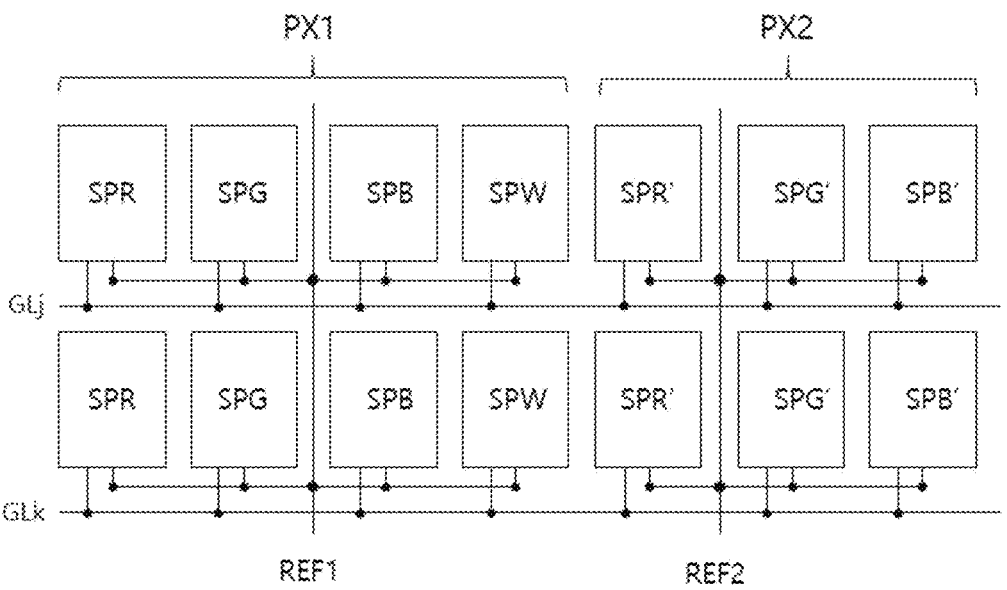
FIG. 20 is a diagram showing a layout of pixels disposed in the display panel according to the experimental example.
Figure 21:
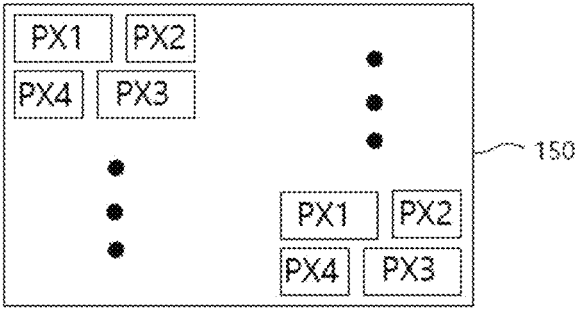
FIG. 21 is a diagram showing a display panel implemented according to an embodiment.
Figure 22:
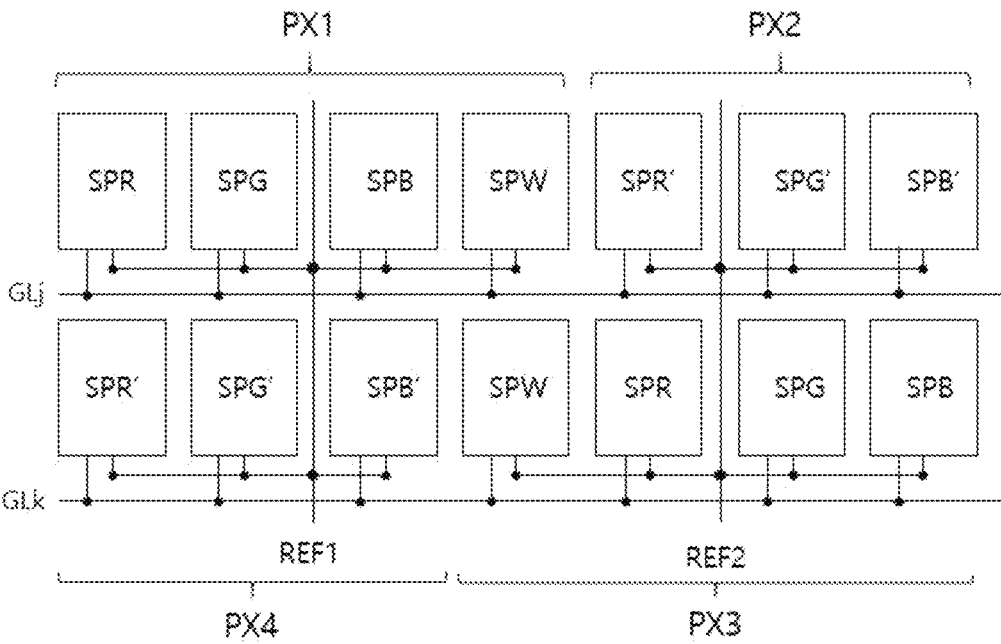
FIG. 22 is a diagram showing a layout of pixels disposed in the display panel according to one embodiment.
Figure 23:
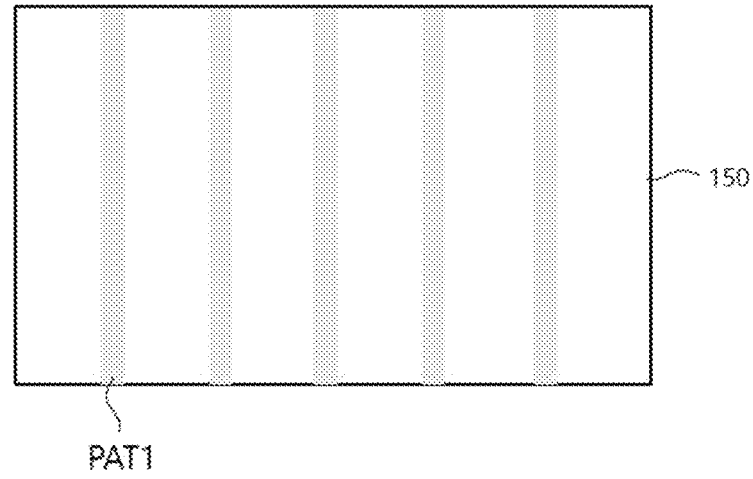
FIG. 23 and FIG. 24 are drawings for comparison between the experimental example and one embodiment.
Figure 24:
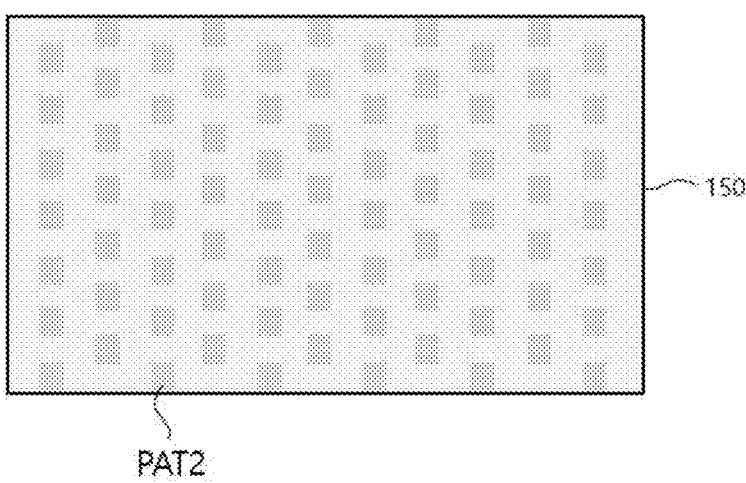

FIG. 19 is a diagram showing a display panel implemented according to an experimental example, FIG. 20 is a diagram showing a layout of pixels disposed in the display panel according to the experimental example, FIG. 21 is a diagram showing a display panel implemented according to an embodiment, FIG. 22 is a diagram showing a layout of pixels disposed in the display panel according to the embodiment, and FIG. 23 and FIG. 24 are diagrams for comparison between the experimental example and the embodiment.

As shown in FIG. 19 and FIG. 20, in the experimental example, the display panel 150 can be implemented based on a first pixel PX1 including four subpixels and a second pixel PX2 including three subpixels. In the experimental example, the display panel 150 is implemented based on the pixels PX1 and PX2 disposed asymmetrically on one side and the other side when viewed from the J-th gate line GLj and the K-th gate line GLk. The display panel 150 according to the experimental example may have a layout in which a group of four subpixels and a group of three subpixels are repeatedly disposed in the direction of all gate lines (or horizontal direction).

As shown in FIG. 21 and FIG. 22, in the embodiment, the display panel 150 can be implemented based on a first pixel PX1 and a third pixel PX3 each including four subpixels, and a second pixel PX2 and a fourth pixel PX4 each including three subpixels. In the embodiment, the display panel 150 is implemented based on the pixels PX1 to PX4 which are disposed asymmetrically on one side and the other side when viewed from one gate line but disposed symmetrical when viewed from two gate lines, as can be seen from the J-th gate line GLj and the K-th gate line GLk.

The display panel 150 according to the embodiment has a layout in which a group of four subpixels and a group of three subpixels are repeatedly disposed not only in the gate line direction but also in the data line direction (or vertical direction).

When the display panel 150 is alternately driven on a frame-by-frame basis in the experimental example shown in FIG. 19 and FIG. 20, a pattern PAT1 in which the luminance decreases in the vertical direction of the display panel 150 may appear in the form of a long vertical line, as shown in FIG. 23.

When the display panel 150 is alternately driven on a frame-by-frame basis in the embodiment shown in FIG. 21 and FIG. 22, a pattern PAT2 in which the luminance decreases in the vertical direction of the display panel 150 may appear in the form of dots, as shown in FIG. 24. When the pattern PAT2 appears in the form of dots in this manner, there is no problem from a cognitive and image quality perspective compared to when the pattern PAT1 appears in the form of vertical lines.

FIG. 23 and FIG. 24 illustrate images that may be displayed on the display panel 150 when a first driving condition in which red, green, and blue subpixels are driven 100%, and a second driving condition in which white subpixels are driven and the red, green, and blue subpixels are driven less than 5% are alternated on a frame-by-frame basis. For example, the patterns PAT1 and PAT2 shown in FIG. 23 and FIG. 24 may be caused by green subpixels, but are not limited thereto.

From comparison between FIG. 23 and FIG. 24, it can be ascertained that the problem of display quality deterioration that may occur in a display panel implemented based on pixels disposed as in the experimental example can be improved when the display panel is implemented and driven based on pixels disposed as in the embodiment.

Hereinafter, the experimental example and the embodiment will be compared and other advantages of the embodiment will be described.

Figure 25:
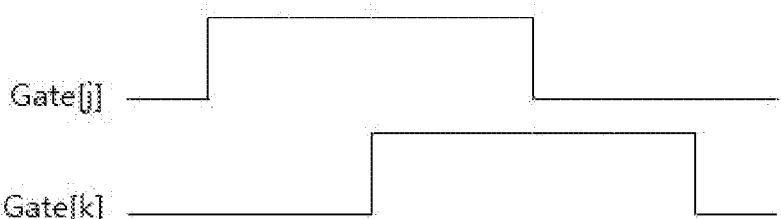
FIG. 25 is a diagram showing waveforms of gate signals for driving the display panel according to the experimental example.
Figure 26:
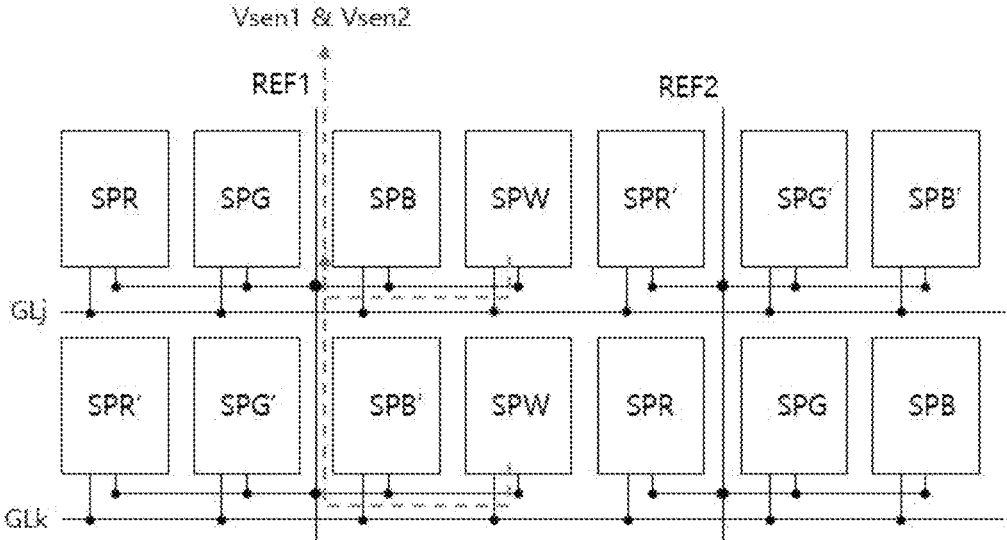
FIG. 26 is a diagram illustrating a first problem that may occur in the experimental example during operation based on the gate signals shown in FIG. 25.
Figure 27:
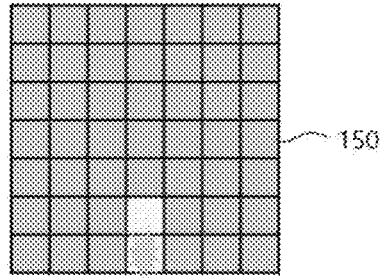
FIG. 27 is a diagram illustrating a second problem that may occur in the experimental example.

FIG. 25 is a diagram showing waveforms of gate signals for driving the display panel according to the experimental example, FIG. 26 is a diagram illustrating a first problem that may occur in the experimental example during operation based on the gate signals shown in FIG. 25, and FIG. 27 is a diagram illustrating a second problem that may occur in the experimental example.

As shown in FIG. 19, FIG. 20, and FIG. 25 to FIG. 27, the display panel 150 according to the experimental example can be driven based on gate signals that overlap each other for a certain period of time. FIG. 25 shows an example in which high voltages (or gate-on voltages) of a J-th gate signal Gate[j] and a K-th gate signal Gate[k] applied to the neighboring J-th gate line GLj and K-th gate line GLk overlap each other for a certain period of time (e.g., ½ time).

Meanwhile, when the gate signals Gate[j] and Gate[k] that overlap for a certain period of time are applied to the display panel 150 according to the experimental example, and white subpixels SPW connected to the first reference line REF1 are sensed, a problem of mixing of sensing values may occur.

As an example, FIG. 26 shows that, when sensing operation is performed in a period in which the J-th gate signal Gate[j] and the K-th gate signal Gate[k] overlap, a first sensing value Vsen1 sensed from the white subpixel SPW of the J-th gate line GLj and a second sensing value Vsen2 sensed from the white subpixel SPW of the K-th gate line GLk can be mixed while being acquired through the first reference line REF1.

Further, in the display panel 150 according to the experimental example, two subpixels adjacent to each other in the vertical direction share one reference line, and thus if there is a problem in one subpixel, the other subpixel may be affected.

FIG. 27 shows an example in which, when operation with the J-th gate signal Gate[j] and the K-th gate signal Gate[k] which overlap is performed, a bright spot (luminance abnormality) occurring in one of two subpixels adjacent to each other in the vertical direction can affect the other subpixel.

Figure 28:
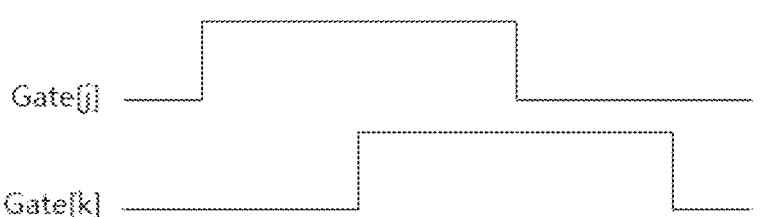
FIG. 28 is a diagram showing waveforms of gate signals for driving the display panel according to one embodiment.
Figure 29:
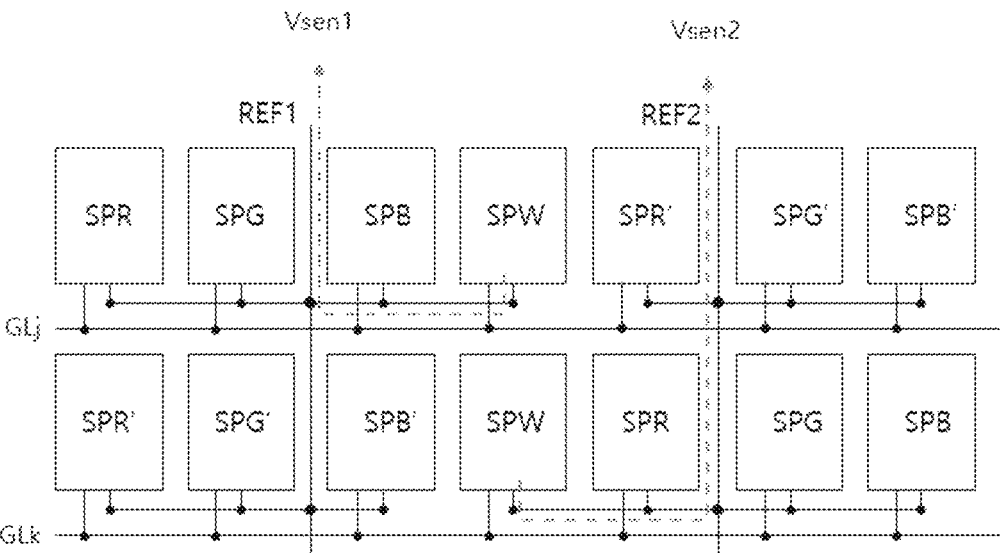
FIG. 29 is a diagram illustrating an embodiment for improving the first problem presented in the experimental example during operation based on the gate signals shown in FIG. 28 according to one embodiment.
Figure 30:
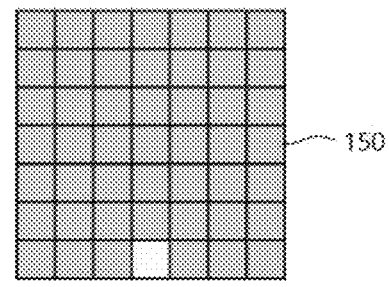
FIG. 30 is a drawing illustrating an embodiment for improving the second problem presented in the experimental example.

FIG. 28 is a diagram showing waveforms of gate signals for driving the display panel according to the embodiment, FIG. 29 is a diagram illustrating an embodiment for improving the first problem presented in the experimental example during operation based on the gate signals shown in FIG. 28, and FIG. 30 is a drawing illustrating an embodiment for improving the second problem presented in the experimental example.

As shown in FIG. 21, FIG. 22, and FIG. 28 to FIG. 30, the display panel 150 according to the embodiment may be driven based on gate signals that overlap each other for a certain period of time. FIG. 28 shows an example in which high voltages (or gate-on voltages) of the J-th gate signal Gate[j] and the K-th gate signal Gate[k] applied to the neighboring J-th gate line GLj and K-th gate line GLk overlap each other for a certain period of time (e.g., ½ time).

Meanwhile, when the gate signals Gate[j] and Gate[k] that overlap for a certain period of time are applied to the display panel 150 according to the embodiment, and the white subpixel SPW connected to the first reference line REF1 is sensed, a problem of mixing of sensing values may not occur.

As an example, FIG. 29 shows that, when sensing operation is performed in a period in which the J-th gate signal Gate[j] and the K-th gate signal Gate[k] overlap, the first sensing value Vsen1 sensed from the white subpixel SPW of the J-th gate line GLj is acquired through the first reference line REF1 and the second sensing value Vsen2 sensed from the white subpixel SPW of the K-th gate line GLk is acquired through the second reference line REF2, and thus a problem of mixing of these sensing values does not occur. In one embodiment, a data voltage of at least one of the first pixel PX1 that includes the white subpixel SPW or the third pixel PX3 that includes the white subpixel SPW is compensated based on the first sensing value Vsen1 and the second sensing value Vsen2, respectively.

Further, in the display panel 150 according to the embodiment, two subpixels adjacent to each other in the vertical direction are connected to different reference lines instead of sharing one reference line, and thus even if there is a problem in one subpixel, the other subpixel may not be affected.

FIG. 30 shows an example in which, even if operation with the J-th gate signal Gate[j] and the K-th gate signal Gate[k] which overlap is performed, a bright point (luminance abnormality) occurring in one of two subpixels adjacent to each other in the vertical direction does not affect the other subpixel.

As can be ascertained through a comparison between the experimental example and the embodiment, the embodiment does not cause a problem of mixing of sensing values obtained from two subpixels even if operation is performed with two gate signals applied to gate lines adjacent to each other in the vertical direction, which overlap for a certain period of time. Additionally, in the embodiment, a bright spot (luminance abnormality) appearing in one of two subpixels vertically adjacent to each other does not affect the other subpixel. Accordingly, the embodiment can improve (offset) the problem of deviation that may occur on the display panel and minimize flicker or image interference.

Further, the light emitting display device according to the embodiment may compensate for deterioration of at least one of the subpixels included in each of the first pixel and the second pixel on the basis of the first sensing value Vsen1 and the second sensing value Vsen2, and compensate for deterioration of at least one subpixel included in the display panel accordingly.

Hereinafter, examples that can be referred to when pixels are implemented according to the embodiment will be described.

Figure 31:
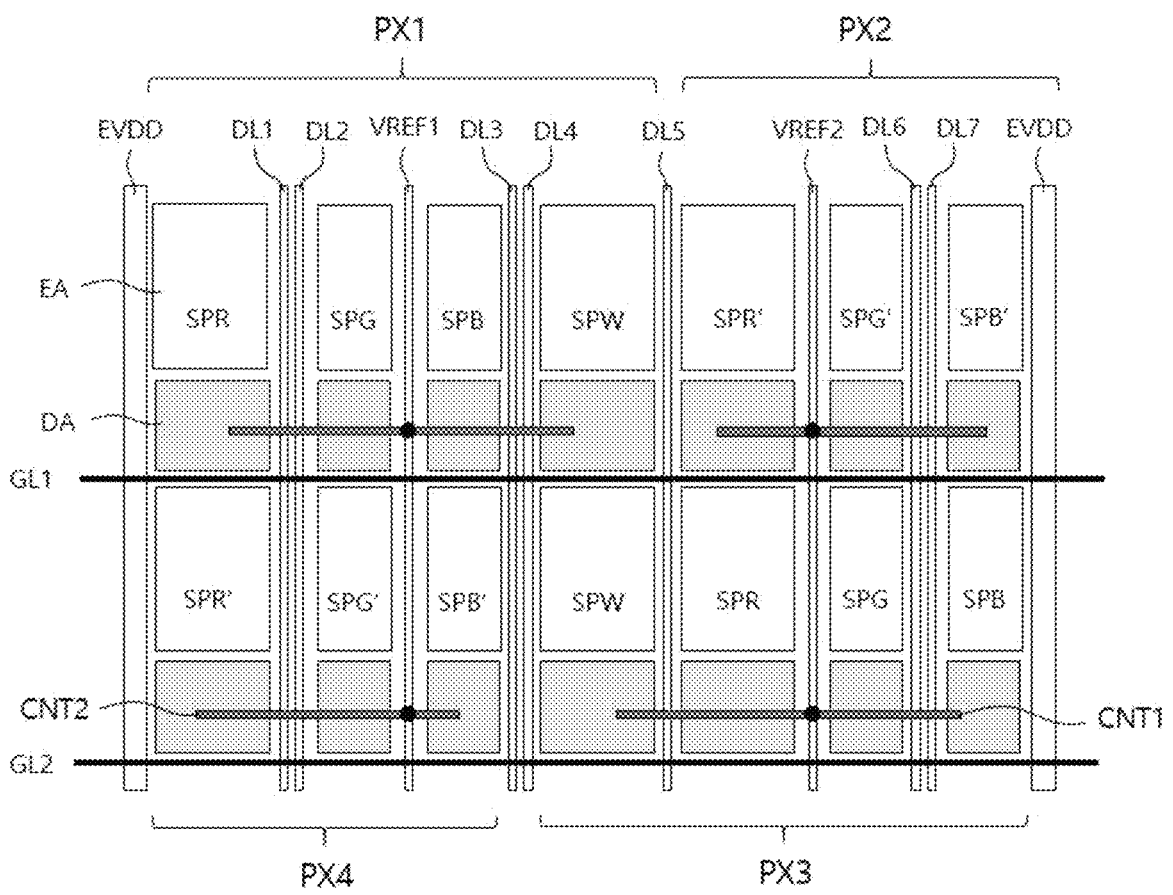
FIG. 31 is a diagram illustrating a first example that can be referred to when pixels are implemented according to an embodiment.
Figure 32:
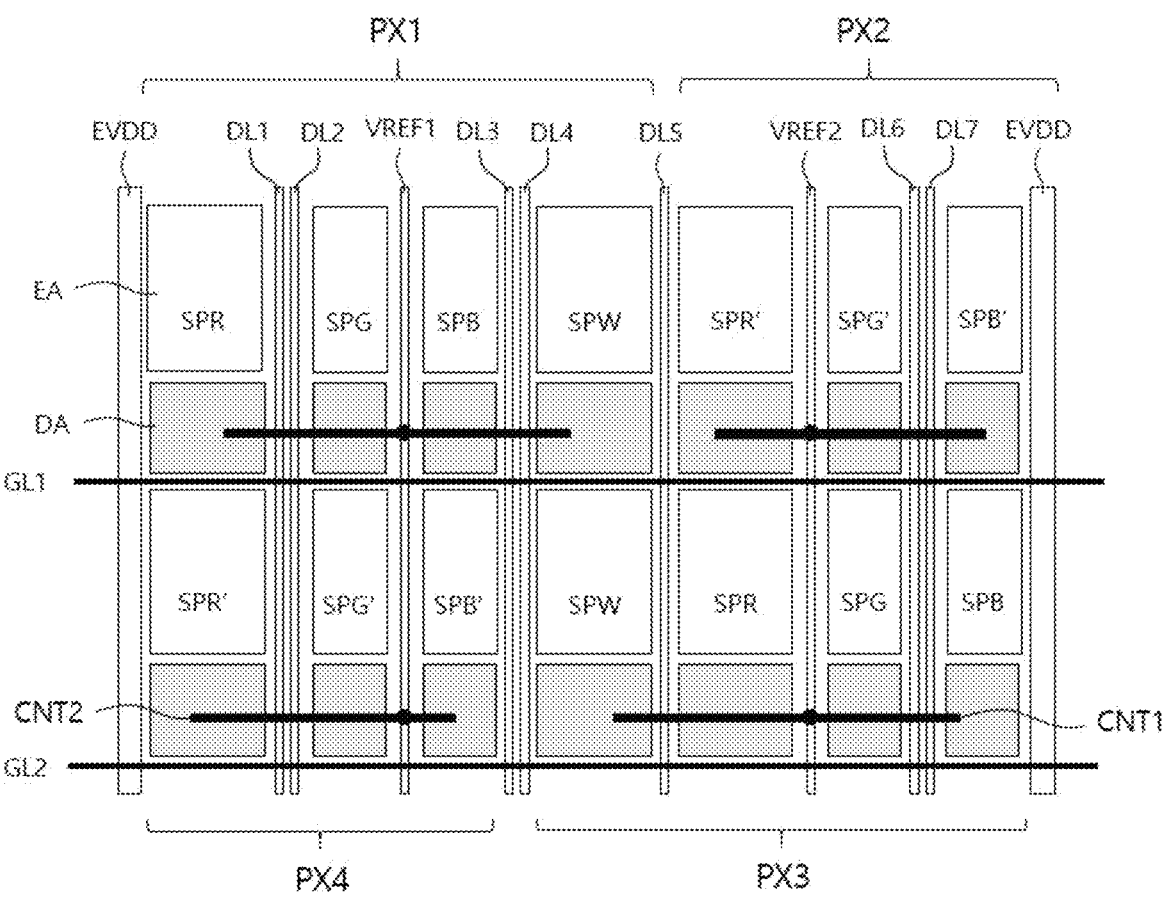
FIG. 32 is a diagram illustrating a second example that can be referred to when pixels are implemented according to an embodiment.

FIG. 31 is a diagram illustrating a first example that can be referred to when pixels are implemented according to the embodiment, and FIG. 32 is a diagram illustrating a second example that can be referred to when pixels are implemented according to the embodiment.

As shown in FIG. 31 and FIG. 32, pixels PX1 to PX4 according to the embodiment may include a plurality of subpixels. The plurality of subpixels may include an emission area EA and a circuit area DA. The emission area EA is an area where light is emitted and can be defined as an area where the organic light emitting diode OLED shown in FIG. 7 or FIG. 8 is located. The circuit area DA is an area where a circuit for driving the organic light emitting diode OLED is located and can be defined as an area where the switching transistor SW, the driving transistor DT, the sensing transistor ST, and the capacitor CST shown in FIG. 7 or FIG. 8 are located.

The pixels PX1 to PX4 according to the embodiment may include red subpixels SPR and SPR', green subpixels SPG and SPG', blue subpixels SPB and SPB', and white subpixels SPW, and the red subpixels SPR and SPR' and the white subpixels SPW may have the largest emission area EA.

The pixels PX1 to PX4 according to the embodiment may be located in an area between a first power line EVDD disposed on a first side and the first power line EVDD disposed on a second side. The pixels PX1 to PX4 according to the embodiment may include a first reference line VREF1 and a second reference line VREF2 disposed between the first power line EVDD disposed on one side and the first power line EVDD disposed on the other side. The pixels PX1 to PX4 according to the embodiment may include first to seventh data lines DL1 to DL7.

The pixels PX1 to PX4 according to the embodiment may include a first gate line GL1 connected to the first pixel PX1 and the second pixel PX2, and a second gate line GL2 connected to the third pixel PX3 and the fourth pixel PX4. The pixels PX1 to PX4 according to the embodiment may include a first connection line CNT1 having a first length for connecting four subpixels to one reference line and a second connection line CNT2 having a second length less than the first length for connecting three subpixels to one reference line.

The first power line EVDD, the first data line DL1 to the seventh data line DL7, the first reference line VREF1, and the second reference line VREF2 may be disposed to be spaced apart at certain intervals in the vertical direction on the substrate. The first gate line GL1 and the second gate line GL2 may be disposed to be spaced apart from each other at a certain interval in the horizontal direction on the substrate. The first connection line CNT1 and the second connection line CNT2 may be disposed to be spaced apart at a certain interval in the horizontal direction on the substrate.

As in the first example shown in FIG. 31, the first power line EVDD, the first data line DL1 to the seventh data line DL7, the first reference line VREF1, and the second reference line VREF2 may be formed using a shield metal layer located at the lowest layer on the substrate or a source-drain metal layer located above the shield metal layer. At least one of the first power line EVDD, the first data line DL1 to the seventh data line DL7, the first reference line VREF1, and the second reference line VREF2 may be formed as a single layer or multiple layers.

The first gate line GL1 and the second gate line GL2 may be formed using a gate metal layer located between the shield metal layer and the source-drain metal layer. The first connection line CNT1 and the second connection line CNT2 may be formed using a semiconductor layer (active layer) located between the shield metal layer and the gate metal layer.

As in the second example shown in FIG. 32, the first power line EVDD, the first data line DL1 to the seventh data line DL7, the first reference line VREF1, and the second reference line VREF2 may be formed using the shield metal layer located at the lowest layer on the substrate or the source-drain metal layer located above the shield metal layer. At least one of the first power line EVDD, the first data line DL1 to the seventh data line DL7, the first reference line VREF1, and the second reference line VREF2 may be formed as a single layer or multiple layers.

The first gate line GL1, the second gate line GL2, the first connection line CNT1, and the second connection line CNT2 may be formed using the gate metal layer located between the shield metal layer and the source-drain metal layer.

As can be ascertained from the first example shown in FIG. 31 and the second example shown in FIG. 32, the asymmetric relationship between the pixel including four subpixels and the pixel including three subpixels can be regarded as a symmetrical relationship when viewed from the entire display panel 150 due to the connection structures of the first connection line CNT1 and the second connection line CNT2. Further, in addition to the first connection line CNT1 and the second connection line CNT2, any conductive layer located on layers different from the layer on which the data lines DL1 to DL7 are located can cause the asymmetric relationship of the pixels to become a symmetrical relationship throughout the display panel 150. In addition, as shown in FIG. 31 and FIG. 32, since one white subpixel per two pixels neighboring in the lateral direction can be omitted in the embodiment, the aperture ratio can be improved and the number of pad pins can be reduced, and thus it is possible to provide a structure in which a display panel with a high aperture ratio and high PPI can be implemented.

When the display panel is implemented based on FIG. 31 and FIG. 32, pixels may be disposed for the third gate line in the same layout as that for the first gate line GL1, and pixels may be disposed for the fourth gate line in the same layout as that for the second gate line GL2. Additionally, pixels may be disposed such that the structure of the pixels disposed for a total of four gate lines is repeated for the remaining gate lines in the same manner.

However, the embodiment is not limited thereto, and pixels may be disposed for the third gate line in the same layout as that for the second gate line GL2 and pixels may be disposed for the fourth gate line in the same layout as that for the first gate line GL1. Additionally, pixels may be disposed such that the structure of the pixels disposed for a total of four gate lines is repeated for the remaining gate lines in the same manner.

As described above, the present disclosure has the effects of improving (offsetting) the problem of deviation that may occur on the display panel and enhancing display quality by minimizing or at least reducing flicker or image interference. In addition, the present disclosure has the effect of improving the lifespan without burn-in by enabling implementation of a display panel with a high aperture ratio and high PPI.

It will be apparent to those skilled in the art that various modifications and variations can be made in the present disclosure without departing from the spirit or scope of the present disclosure. Thus, it is intended that the present disclosure cover the modifications and variations of the present disclosure provided they come within the scope of the appended claims and their equivalents.

What is claimed is:

1. A display device comprising:
a first pixel having a first subpixel count and including a first white subpixel, the first pixel connected to a first gate line and a first reference line;
a second pixel adjacent to the first pixel, the second pixel having a second subpixel count and lacking a white subpixel, the second subpixel count lower than the first subpixel count, the second pixel connected to the first gate line and a second reference line;
a third pixel having the first subpixel count and including a second white subpixel, the third pixel connected to a second gate line and the second reference line; and
a fourth pixel adjacent to the third pixel, the fourth pixel having the second subpixel count and lacking a white subpixel, the fourth pixel connected to the second gate line and the first reference line,
wherein the first pixel and the second pixel are arranged in a first row of pixels in a first direction, and the third pixel and the fourth pixel are arranged in a second row of pixels different from the first row of pixels; and
wherein during a duration while a first gate signal applied to the first gate line and a second gate signal applied to the second gate line have a gate-on level, a first sensing value of the first white subpixel and a second sensing value of the second white subpixel are independently sensed respectively via the first reference line and the second reference line, and a data voltage of at least one of the first pixel or third pixel is compensated based on the first sensing value or the second sensing value, respectively.

2. The display device of claim 1, wherein each of the second pixel and the fourth pixel include three subpixels and each of the first pixel and the fourth pixel include four subpixels.

3. The display device of claim 2, wherein the first pixel includes a first connection line connecting the four subpixels of the first pixel to the first reference line, the second pixel includes a second connection line connecting the three subpixels of the second pixel to the second reference line, the third pixel includes a third connection line connecting the four subpixels of the third pixel to the second reference line, and the fourth pixel includes a fourth connection line connecting the three subpixels of the fourth pixel to the first reference line.

4. The display device of claim 3, wherein a length of the second connection line and a length of the fourth connection line are each less than a length of the first connection line and a length of the third connection line.

5. The display device of claim 4, wherein the length of the second connection line is a same as the length of the fourth connection line, and the length of the first connection line is a same as the length of the third connection line.

6. The display device of claim 3, further comprising:
a shield metal layer;
a gate metal layer included in gate lines of the display device,
wherein the first connection line and the second connection line include a semiconductor layer that is between the shield metal layer and the gate metal layer.

7. The display device of claim 3, wherein the first pixel and the third pixel each includes a first subpixel emitting light of a first color, a second subpixel emitting light of a second color, a third subpixel emitting light of a third color, and a white subpixel emitting white light, and the second pixel and the fourth pixel each include a first subpixel emitting light of the first color, a second subpixel emitting light of the second color, and a third subpixel emitting light of the third color.

8. The display device of claim 7, wherein the first subpixel of the first pixel, the first subpixel of the third pixel, the first subpixel of the second pixel, and the first subpixel of the fourth pixel emit red light,
wherein the second subpixel of the first pixel, the second subpixel of the third pixel, the second subpixel of the second pixel, and the second subpixel of the fourth pixel emit green light, and
wherein the third subpixel of the first pixel, the third subpixel of the third pixel, the third subpixel of the second pixel, and the third subpixel of the fourth pixel emit blue light.

9. The display device of claim 1, further comprising:
a fifth pixel adjacent to the second pixel, the fifth pixel having the first subpixel count and including a third white subpixel, the fifth pixel connected to the first gate line and a third reference line; and
a sixth pixel adjacent to the fifth pixel, the sixth pixel having the second subpixel count and lacking a white subpixel, the sixth pixel connected to the first gate line and a fourth reference line.

10. A display device, comprising:
a first pixel that is connected to a first gate line, the first pixel comprising four subpixels and a first connection line that connect the four subpixels of the first pixel to a first reference line, the first pixel including a first white subpixel;
a second pixel that is connected to the first gate line and adjacent to the first pixel, the second pixel comprising three subpixels and a second connection line that connects the three subpixels of the second pixel to a second reference line, the second pixel lacking a white subpixel;
a third pixel that is connected to a second gate line, the third pixel comprising four subpixels and a third connection line that connect the four subpixels of the third pixel to the second reference line, the third pixel including a second white subpixel; and
a fourth pixel that is connected to the second gate line and adjacent to the third pixel, the fourth pixel comprising three subpixels and a fourth connection line that connect the three subpixels of the fourth pixel to the first reference line, the fourth pixel lacking a white subpixel,
wherein the first pixel and the second pixel are arranged in a first row of pixels in a first direction, and the third pixel and the fourth pixel are arranged in a second row of pixels different from the first row of pixels, and
wherein during a duration while a first gate signal applied to the first gate line and a second gate signal applied to the second gate line have a gate-on level, a first sensing value of the first white subpixel and a second sensing value of the second white subpixel are independently sensed respectively via the first reference line and the second reference line, and a data voltage of at least one of the first pixel or third pixel is compensated based on the first sensing value or the second sensing value, respectively.

11. The display device of claim 10, wherein the first pixel and the third pixel each include a first subpixel emitting light of a first color, a second subpixel emitting light of a second color, a third subpixel emitting light of a third color, and a white subpixel emitting white light, and the second pixel and the fourth pixel each include a first subpixel emitting light of a first color, a second subpixel emitting light of a second color, and a third subpixel emitting light of a third color.

12. The display device of claim 11, wherein the first subpixel of the first pixel, the first subpixel of the third pixel, the first subpixel of the second pixel, and the first subpixel of the fourth pixel emit red light,
wherein the second subpixel of the first pixel, the second subpixel of the third pixel, the second subpixel of the second pixel, and the second subpixel of the fourth pixel emit green light, and
wherein the third subpixel of the first pixel, the third subpixel of the third pixel, the third subpixel of the second pixel, and the third subpixel of the fourth pixel emit blue light.

13. The display device of claim 10, wherein the first connection line, the second connection line, the third connection line, and the fourth connection line include a semiconductor layer located between a shield metal layer and a gate metal layer.

14. A display device comprising:
a display panel including a plurality of pixels that are arranged in a plurality of rows and a plurality of columns of pixels, a plurality of data lines connected to the plurality of pixels, a plurality of gate lines connected to the plurality of pixels, and a plurality of reference lines connected to the plurality of pixels;
a data driver configured to apply data voltages to the plurality of data lines; and
a gate driver configured to apply gate signals to the plurality of gate lines,
wherein the display panel comprises:
a first pixel including a first white subpixel, the first pixel connected to a first gate line from the plurality of gate lines and a first reference line from the plurality of reference lines;
a second pixel adjacent to the first pixel and lacking a white subpixel, the second pixel connected to the first gate line and a second reference line from the plurality of reference lines;
a third pixel including a second white subpixel that is in a same column of pixels as the first white subpixel, the third pixel connected to a second gate line from the plurality of gate lines and the second reference line; and
a fourth pixel adjacent to the third pixel and lacking a white subpixel, the fourth pixel connected to the second gate line and the first reference line,
wherein the first pixel and the second pixel are arranged in a first row of pixels in a first direction, and the third pixel and the fourth pixel are arranged in a second row of pixels different from the first row of pixels,
wherein gate driver is configured to output a first gate signal to the first gate line that turns on the first pixel and the second pixel and a second gate signal to the second gate line after the first gate signal is output that turns on the third pixel and the fourth pixel, the second gate signal having a gate-on level while the first gate signal has the gate-on level and transitions from the gate-on level to a gate-off level, wherein during a duration while the first gate signal and the second gate signal have the gate-on level, a first sensing value of the first white subpixel and a second sensing value of the second white subpixel are independently sensed respectively via the first reference line and the second reference line, and a data voltage of at least one of the first pixel or third pixel is compensated based on the first sensing value or the second sensing value, respectively.

15. The display device of claim 14, wherein the first pixel and the third pixel include a same number of subpixels as each other and the second pixel and the fourth pixel include a same number of subpixels as each other that is less than the number of subpixels included in each of the first pixel and the third pixel.

16. The display device of claim 15, wherein each of the second pixel and the fourth pixel include three subpixels and each of the first pixel and the fourth pixel include four subpixels.

17. The display device of claim 16, wherein the first pixel includes a first connection line connecting the four subpixels of the first pixel to the first reference line, the second pixel includes a second connection line connecting the three subpixels of the second pixel to the second reference line, the third pixel includes a third connection line connecting the four subpixels of the third pixel to the second reference line, and the fourth pixel includes a fourth connection line connecting the three subpixels of the fourth pixel to the first reference line.

18. The display device of claim 17, wherein a length of the second connection line and a length of the fourth connection line are each less than a length of the first connection line and a length of the third connection line.

19. The display device of claim 18, wherein the length of the second connection line is a same as the length of the fourth connection line, and the length of the first connection line is a same as the length of the third connection line.

20. The display device of claim 15, wherein the first pixel and the third pixel each includes a first subpixel emitting light of a red color, a second subpixel emitting light of a blue color, a third subpixel emitting light of a green color, and the respective first white subpixel and the second white subpixel that emits white light, and wherein the second pixel and the fourth pixel each include a first subpixel emitting light of the red color, a second subpixel emitting light of the blue color, and a third subpixel emitting light of the green color.

\* \* \* \* \*